United States Patent [19]
Gilbert

[11] Patent Number: 5,572,166
[45] Date of Patent: Nov. 5, 1996

[54] LINEAR-IN-DECIBEL VARIABLE GAIN AMPLIFIER

[75] Inventor: Barrie Gilbert, Portland, Oreg.

[73] Assignee: Analog Devices, Inc., Norwood, Mass.

[21] Appl. No.: 472,901

[22] Filed: Jun. 7, 1995

[51] Int. Cl.$^6$ ................................ H03F 3/45; H03G 3/30
[52] U.S. Cl. ............................................ 330/254; 327/346
[58] Field of Search .................................. 327/346, 350, 327/351, 352; 330/254, 279, 285

[56] References Cited

U.S. PATENT DOCUMENTS

| | | | |
|---|---|---|---|
| 4,621,238 | 11/1986 | Fenk | 330/254 |
| 4,990,803 | 2/1991 | Gilbert | 327/351 |
| 5,442,311 | 8/1995 | Trafton | 327/346 X |

*Primary Examiner*—Steven Mottola
*Attorney, Agent, or Firm*—Marger, Johnson, McCollom & Stolowitz P.C.

[57] ABSTRACT

A gain control circuit provides linear-in-decibel gain control for an RF signal variable gain amplifier. The gain control circuit utilizes the transconductance characteristics of bipolar transistors to generate a logarithmic relationship between a gain control current and an amplifier bias current. The gain control circuit comprises essentially a current mirror having two transistors with a resistor coupled between the associated base terminals of the two transistors. A third transistor and a resistor are also provided to absorb the gain control current. The gain control current is applied to the base of a first one of the two transistors and a voltage is thereby established across the resistor. This voltage subtracts from the base-to-emitter voltage of the second transistor thereby producing a corresponding exponential reduction in the current through the second transistor. This current is provided to a gm stage, whose gain is linearly proportional to this current. Thus, a linear change in the gain control current produces an exponential change in the gain of the gm stage. Accordingly, a linear-in-dB variable gain amplifier is achieved.

30 Claims, 8 Drawing Sheets

LINEAR-IN-DECIBEL VARIABLE GAIN AMPLIFIER

BACKGROUND OF THE INVENTION

This invention relates generally to variable-gain small signal amplifiers and more particularly to a linear-in-decibel gain control circuit.

In communications systems, analog receivers vary the amount of gain according to the specific receiver operation and the strength of the received signal in order to maintain a constant signal level. Variable-gain amplifiers are typically used to achieve this desired effect in the receiver. Because of the wide range of received signal strength, the variable gain amplifier must be able to vary its gain over a wide range.

So-called linear-in-decibel variable gain amplifiers are known to provide this desired level of gain control. These amplifiers take advantage of the fact that a change in forward current through a diode produces a change in voltage across the diode that is proportional to the logarithm of the current according to the well-known junction equation: $VF=(kF/q) \log (I_F/I_S)$. For example, a decade increase in forward current at room temperature produces a voltage increase of about 60 mV for a typical diode. Thus, variable gain amplifiers can be designed that produce a decade of gain increase for every 60 mV of voltage change across a diode.

An example of such a linear-in-decibel variable gain amplifier is shown in U.S. Pat. No. 3,736,520 entitled "Precision Variable Gain Amplifier with Linear Log-Gain versus Control-Voltage Characteristic," by Acker. The problem with this and other linear-in-decibel variable gain amplifiers is that they are complex, typically requiring one or more operational amplifiers to implement. They also suffer from accuracy and bandwidth limitations.

Accordingly, a need remains for a simple yet accurate variable amplifier which is linear-in-decibels.

SUMMARY OF THE INVENTION

A variable gain amplifier having accurate linear-in-decibel gain control over a wide range of gains is provided. The amplifier includes a gain control circuit that produces an exponentially varying bias current responsive to a linearly changing gain control current. This bias current is then provided to an amplifier whose gain is proportional to the bias current. The exponential relationship between the gain control current and the bias current causes the amplifier gain to change exponentially in relation to linear changes in the gain control current. Linear-in-decibel gain control is thereby achieved.

The gain control circuit comprises two transistors forming essentially a current mirror having a resistor between their respective base terminals. The gain control current is applied to the base of a first one of these transistors. The voltage drop across the resistor, which can be varied by adjusting the gain control current, produces a corresponding change in the base-to-emitter voltage in the second transistor. This change in the base-to-emitter voltage produces an exponential change in the current through the second transistor, and, therefore, a corresponding exponential change in the current in the second transistor. The current through the second transistor is then provided to the amplifier as the bias current, thereby producing an exponential change in the amplifier gain. This relationship between the gain control current and the resulting gain in the amplifier is referred to herein as "linear-in-dB" because an exponential gain function is linear on a log scale.

The gain control circuit also includes an third transistor provided, in part, to absorb the gain control current. A resistor is coupled between the base of the second transistor and ground to provide a path for the gain control current. A compensation circuit is also included that provides additional drive current and the ability to maintain a consistent gain response for small transistor beta values.

An application of the gain control circuit is also provided. Multiple gain control circuits are used in conjunction with a multiple gain stages in an automatic gain control (AGC) amplifier circuit. Each variable gain stage of the amplifier circuit uses, for example, a multi-tanh triplet, which include three differential pairs with varying emitter area ratios coupled in parallel to form an effective transconductance stage having improved linearity. The varying emitter areas is accomplished in one stage by having physically larger emitters in some of the transistors than others. In another stage, the emitter area ratios are synthesized by operating the differential pairs at different operating points by use of resistors. The differential pairs in the multi-tanh triplets are biased by current sources that are controlled by the gain control circuit according to the invention.

The foregoing and other objects, features and advantages of the invention will become more readily apparent from the following detailed description of a preferred embodiment of the invention which proceeds with reference to the accompanying drawings.

DETAILED DESCRIPTION

Figure 1:
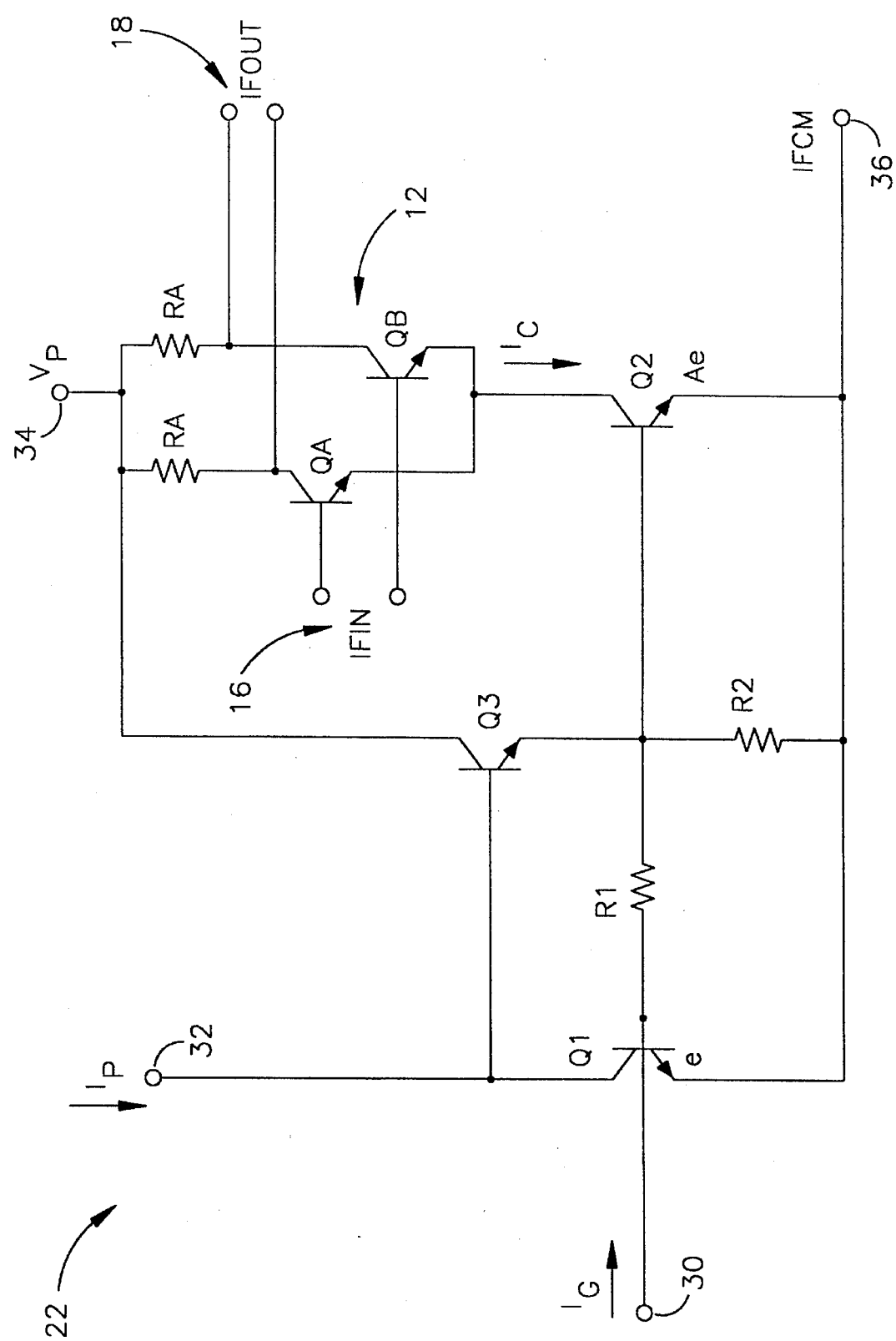
FIG. 1 is a circuit diagram of a gain control circuit according to the invention.

FIG. 1 is a circuit diagram of a variable-gain amplifier having linear-in-decibel gain control. The linear-in-decibel gain control is provided by a gain control circuit 22 according to the invention. The actual gain is provided by an amplifier 12 comprised of transistors QA and QB arranged as a classic differential pair. The gain of the amplifier 12 is measured as the ratio of the output signal IFOUT at output terminals 18 to the input signal IFIN at input terminals 16. The gain control circuit 22 produces an exponential increase in the gain of the amplifier 12 for a linear incremental change in a gain control current $I_G$.

The gain control circuit 22 includes transistors Q1, Q2, and Q3 and resistors R1 and R2. The emitter areas of Q1 and Q2 may be different. The base of transistor Q1 is coupled to an input terminal 30 to which the gain control current $I_G$ is applied. The base of Q1 is also coupled to the base of Q2 by resistor R1. The collector of Q1 is coupled to an input terminal 32 for receiving a primary bias current $I_P$. The bias current $I_P$ flows through transistor Q1 with the help of emitter-follower Q3, whose base is coupled to the collector of Q1 and its emitter coupled to the base of Q1 through resistor R1. Transistor Q3 is in turn biased by resistor R2.

The collector of Q2 is coupled to the emitters of QA and QB to provide a bias current $I_C$ thereto. As is known in the art, the amplifier 12 has a gain which is proportional to the transconductance gm of the transistors QA and QB. It is further known that the transconductance gm is proportional to the bias current $I_C$. Thus, by varying the bias current $I_C$, the gain control circuit 22 can produce a corresponding linear change in the gain of the amplifier 12.

In operation, if the gain control current $I_G$ applied at terminal 30 is zero and the NPN betas (β) of transistors Q1 and Q2 are very high, transistors Q1 and Q2 operate in a manner similar to a current mirror where the collector current of Q2 operates at a multiple of the primary bias current $I_P$. In this case, the collector current of Q2 is a function of the emitter-area ratio "A" between Q1 and Q2. For example, if the emitter-area of Q1 is defined as "e" and the emitter-area of Q2 is "7e", the collector current $I_C$ at Q2 will be approximately $7I_P$. There is, however, a small current at the base of Q1 even when $I_G$ is equal to zero due the bias current $I_P$, which flows in R1. Thus, the peak current through Q2 is actually slightly higher than $7I_P$ because of the voltage drop across R1.

If the gain control current at terminal 30 is set to a general non-zero value $I_G$, however, the current in resistor R1 creates a reduction of $\Delta V_{BE}=I_G*R1$ between the base-emitter voltage ($V_{BE1}$) of Q1 and $V_{BE2}$ of Q2. The collector current of Q2 ($I_C$), which is an exponential function of the base-to-emitter voltage $V_{BE2}$, is therefore reduced by the ratio $\exp(\Delta V_{BE}/V_T)$, where $V_T$ is of course the thermal voltage equal to kT/q. The collector current of Q2, which is also the bias current $I_C$ of amplifier circuit 12, can then be expressed as the following function of the gain current $I_G$:

$$I_C = A \times I_P \times \exp(-I_G \times R1/V_T).$$

where A is the emitter area ratio of $Q_2$ to $Q_1$. Thus, the bias current $I_C$ provided by transistor Q2 decreases exponentially with corresponding linear increases in the gain control current $I_G$.

The resistor value of R1 in the preferred embodiment, is chosen so that a 1 micro-amp (μA) change in $I_G$ creates a $\Delta V_{BE}$ of 1 millivolt (mV) and consequently a change of exp(1/26), or approximately 0.333 dB in the gain of amplifier 12. Thus, a 75 μA full-scale change in $I_G$ (e.g., 2 μA–77 μA) results in a gain change of 75*0.333 dB, or 25 dB.

The transistor Q3 is provided, in part, to absorb the change in $I_G$ at terminal 30 (e.g. 2 μA–77 μA). Transistor Q3 introduces a nonlinearity, however, due to the variation in its base current responsive to a change in $I_G$. The base current varies as a function of $I_G$ because this current subtracts from the current in R2, which is a function of the base-to-emitter voltage ($V_{BE}$) of Q2 that, in turn, is also dependent on $I_G$, as described above. For a nominal beta (β) of 110, the variance in $I_G$ would create a base-current variation of about 0.7 μA in Q3. The variable base current in Q3 correspondingly varies the amount of primary bias current $I_P$ supplied into the collector of Q1, thereby creating a gain nonlinearity. This nonlinearity becomes a problem for small beta values (e.g., 1/3rd-nominal betas), when a base current change of 2 μA would represent a roughly 2%, or 0.17 dB, nonlinearity.

Figure 2:
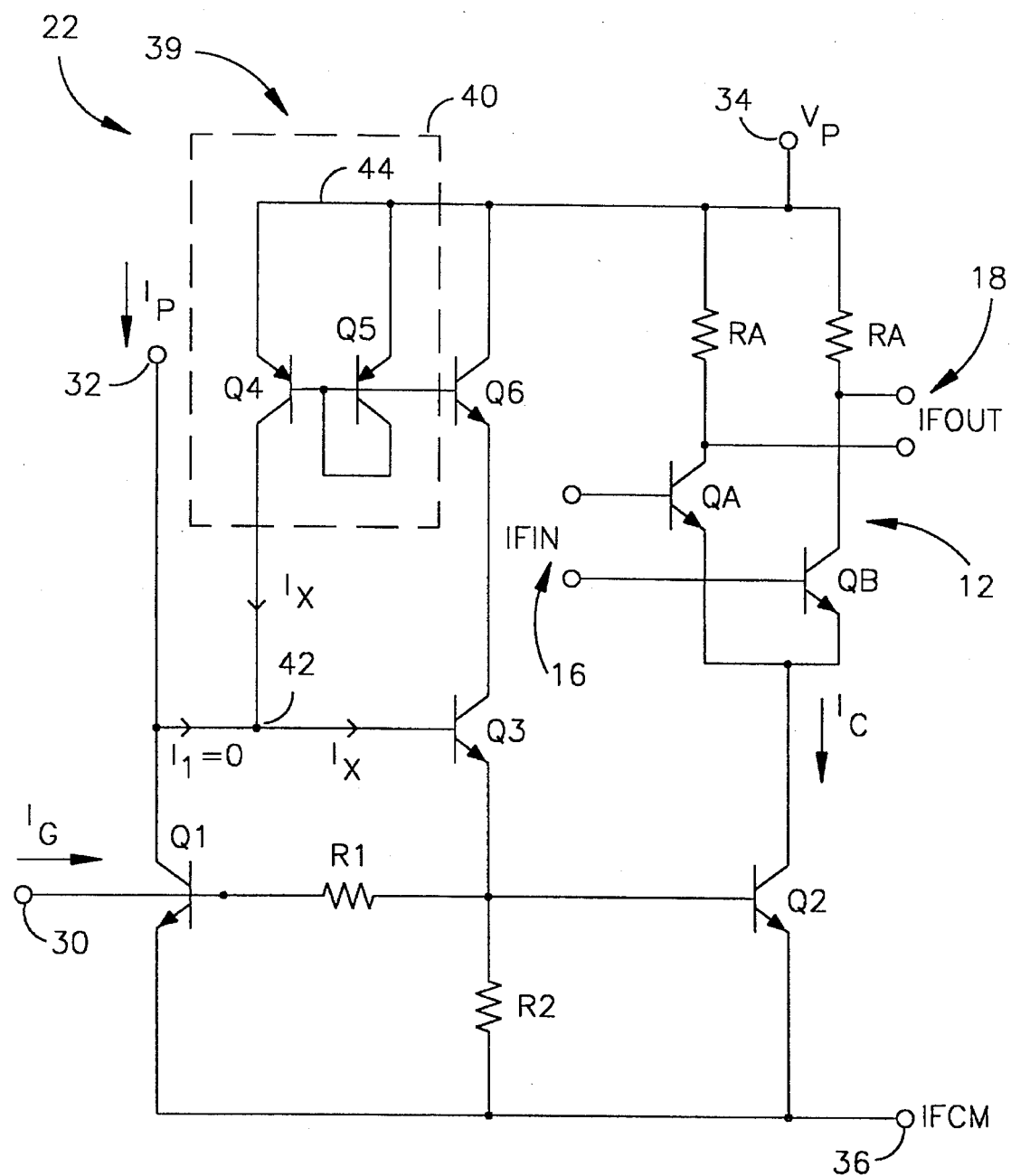
FIG. 2 is a circuit diagram of the gain control circuit in FIG. 2 including an additional compensation circuit.

FIG. 2 is the gain control circuit 22 of FIG. 1 including an additional compensation circuit 39 for reducing the nonlinear effects caused by finite beta (β) values. The compensation circuit 39 includes a transistor Q6 coupled at its emitter terminal to the collector of Q3. The base of transistor Q6 is coupled to the base of Q3 through a current mirror 40.

The base current of transistor Q6 closely replicates the base current of Q3 because the same current flows through Q6 and Q3. The current mirror 40 generates a current $I_X$ which is the "mirror" of the base current of Q6 and thus supplies current $I_X$ to the base of Q3 so that none of the current $I_P$ is lost to the base of Q3. Thus, the collector current of Q1 is no longer dependent on $I_G$ over the full range of voltage and beta variations.

Figure 3:
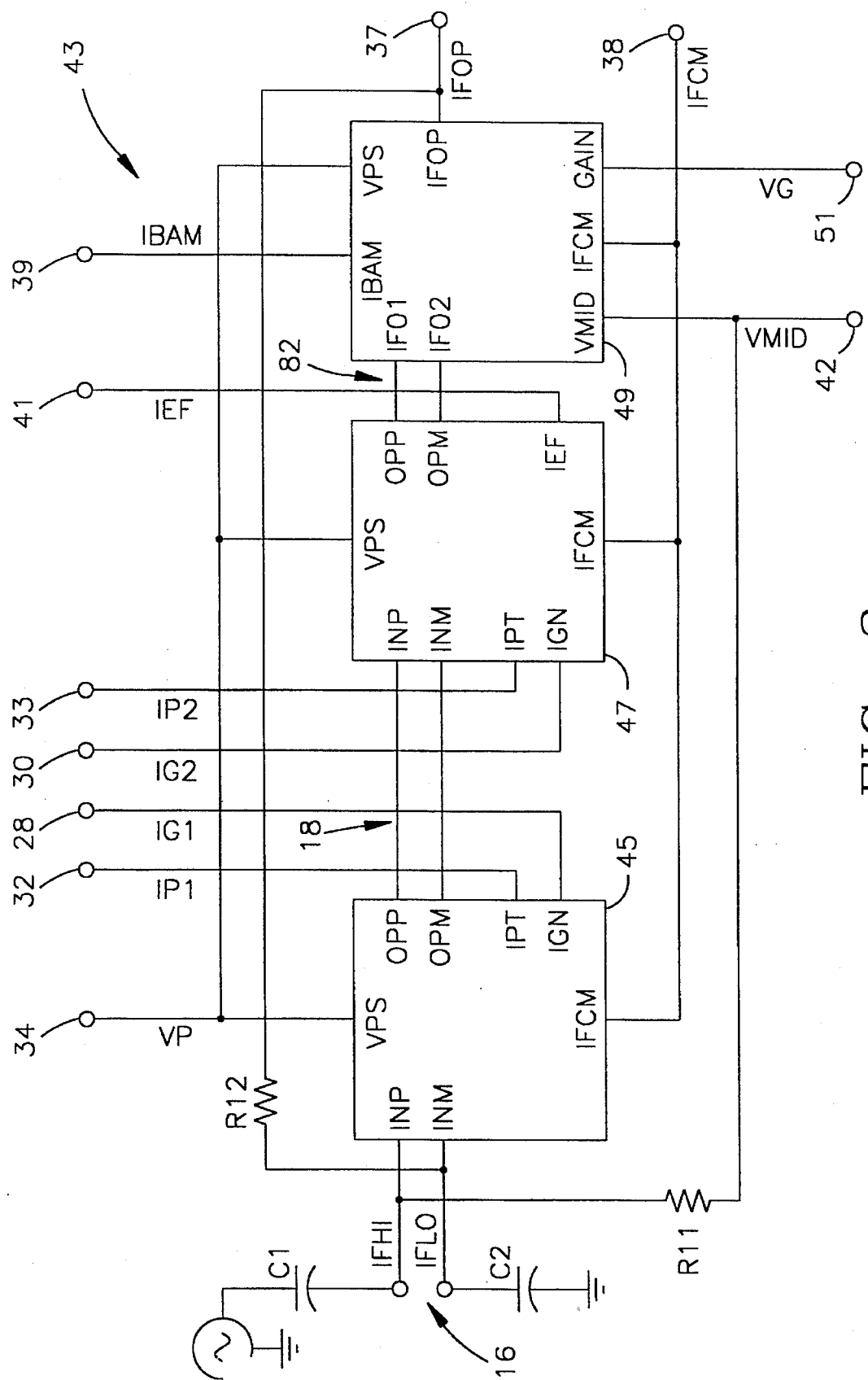
FIG. 3 is a schematic diagram of a multi-stage automatic gain control (AGC) amplifier system according to the invention.

FIG. 3 is a schematic diagram of a multi-stage automatic gain control (AGC) amplifier system 43 which uses the linear-in-decibel gain control circuit 22 shown in FIG. 2. The amplifier system 43 includes three sections. A first amplifier stage is located in section 45 and second and third amplifier stages are located in section 47. The three amplifier stages are coupled together in series and each have a variable gain span of 25 dBs. The stages are DC-coupled throughout, and therefore use an overall negative-feedback path to null the first-stage offset and stabilize the working point. A final gain stage is located in section 49 and provides a fixed gain of 20 dB and a differential-to-single-sided conversion to a final intermediate frequency (IF) output IFOP at terminal 37. The overall gain of the system 43 varies from 7.5 dB to 82.5 dB as a gain control voltage $V_G$ at terminal 51 varies from 2 V to 0 V, respectively. The final stage includes an AGC detector, designed to stabilize the IF output when not overridden by a manual gain-control voltage $V_G$ at a GAIN input.

The input signals applied to the system 43 are defined as follows: inputs IFHI and IFLO at terminals 16 are differential intermediate signals; $V_P$ at terminal 34 is a supply voltage; $I_{P1}$ and $I_{P2}$ at terminals 32 and 33, respectively, are separately controllable primary bias currents; $I_{G1}$ and $I_{G2}$ at terminals 28 and 30, respectively, are separately controllable gain control currents; IEF at terminal 41 is a bias current; IFCM at terminal 38 is a common reference voltage (ground); VMID at terminal 42 is an intermediate reference voltage, nominally at the mid-point between the supply rails; and $V_G$ is an output of an AGC detector stage, which may be used to control the currents $I_{G1}$ and $I_{G2}$.

A bias return resistor R11 is coupled between the terminal 42, which receives the sub-rail voltage VMID, and the IFHI input terminal 16. The IFLO input terminal 16 is connected to the final output terminal 37 of the IF strip via a second resistor R12, which provides a DC-stabilization feedback path in conjunction with C2 to ensure that the final output IFOP remains centered over the full gain range. Resistors R11 and R12 introduce balanced voltage drops of typically 47 mV at $V_G$=0 V and 2.5 mV at $V_G$=2 V (for nominal betas).

Figure 4:
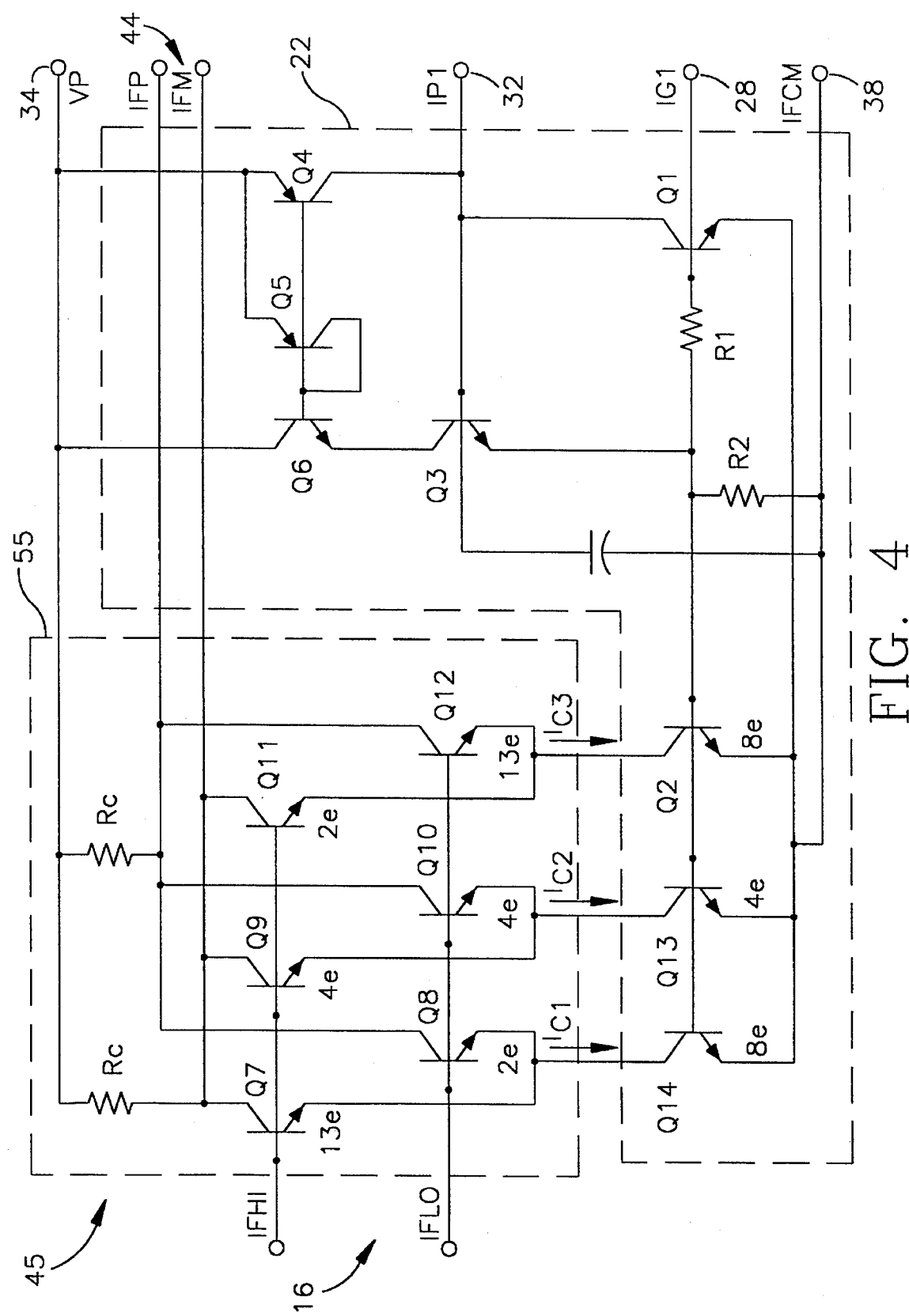
FIG. 4 is a detailed circuit diagram of a first amplifier stage for the amplifier system shown in FIG. 3.

FIG. 4 is a detailed circuit diagram of the first amplifier stage located in section 45 in FIG. 3. Amplifier stage 45 includes the gain control circuit 22 previously shown in FIG. 2 and a "multi-tanh triplet" 55, which is coupled to the gain control circuit 22 to receive three bias currents ($I_{C1}$–$I_{C3}$) therefrom. The multi-tanh triplet is used in place of a single transconductance (gm) stage because of its improved linearity. The operation of the multi-tanh triplet is described in detail in my copending application, filed Nov. 23, 1994, Ser. No. 08/344,375 entitled, "Low Supply Voltage Mixer Having Overlapping Input Signal Ranges," assigned to the present assignee, incorporated herein by reference. The relative emitter ratios are shown adjacent the corresponding transistors. In general, any number of differential pairs can be ganged together to form a "multi-tanh n-tuple." The multi-tanh n-tuple, for example, the so-called "doublet" with N=2, can be used in place of a single transconductance ($g_m$) stage for further improved linearity in the amplifier stage.

The multi-tanh triplet comprising transistors Q7–Q12 has an outer emitter area ratio of 6.5:1 between Q7,Q8 and Q12,Q11. An outer-to-inner current ratio of 2:1 is set by the current-source transistors Q2, Q13, and Q14, i.e., 8:4. The area ratios of these transistors create an essentially flat differential gain of +/−0.1 dB for instantaneous DC inputs of +/−40 mV, and a −1 dB differential gain error at +/−56 mV. These figures are typical of an optimal design.

Amplifier stage 45 provides a gain span of 25 dB (+20 dB to −5 dB), relatively low noise, and the capability of handling inputs as large as +/−56 mV without significant distortion. The variable-gain scheme is controlled by the current $I_{G1}$ of 2–77 µA applied to terminal 28. The primary bias current $I_{P1}$ of 50 µA is applied at terminal 32. The gain of amplifier stage 45 is linearly proportional to $I_P$.

As described above in FIGS. 1 and 2, a change in current $I_{G1}$ from 2 to 77 µA at terminal 28 produces a $\Delta V_{BE}$ variation of 75 mV in Q2, Q13 and Q14 when R1=1KΩ. This lowers the bias currents in the multi-tanh triplet in an exponential fashion, by a ratio of 17.9 (i.e., exp (75/26)), or 25 dB. Transistors Q4–Q6 provide beta compensation for the gain control circuit 22 as previously described in FIG. 2.

As well as being involved in the variable-gain system, resistor R1 also provides beta (β) compensation for the overall circuit. The base current in Q1 causes the voltage on the bases of the current-source transistors Q2, Q13 and Q14 to be a little higher than that at the base of Q1, by an amount dependent on beta (β). An emitter resistance for Q1 at 50 µA is close to 500Ω, so the incremental effect of a 1KΩ base resistor R1 introduces a "two beta's worth" increase in the collector currents of Q2, Q13 and Q14. These compensate for the effect of finite betas (β) in the gm sections of the multi-tanh triplet and for the loading of this first amplifier stage by the beta-dependent loading of the second amplifier stage 47 (FIG. 3).

Figure 5:
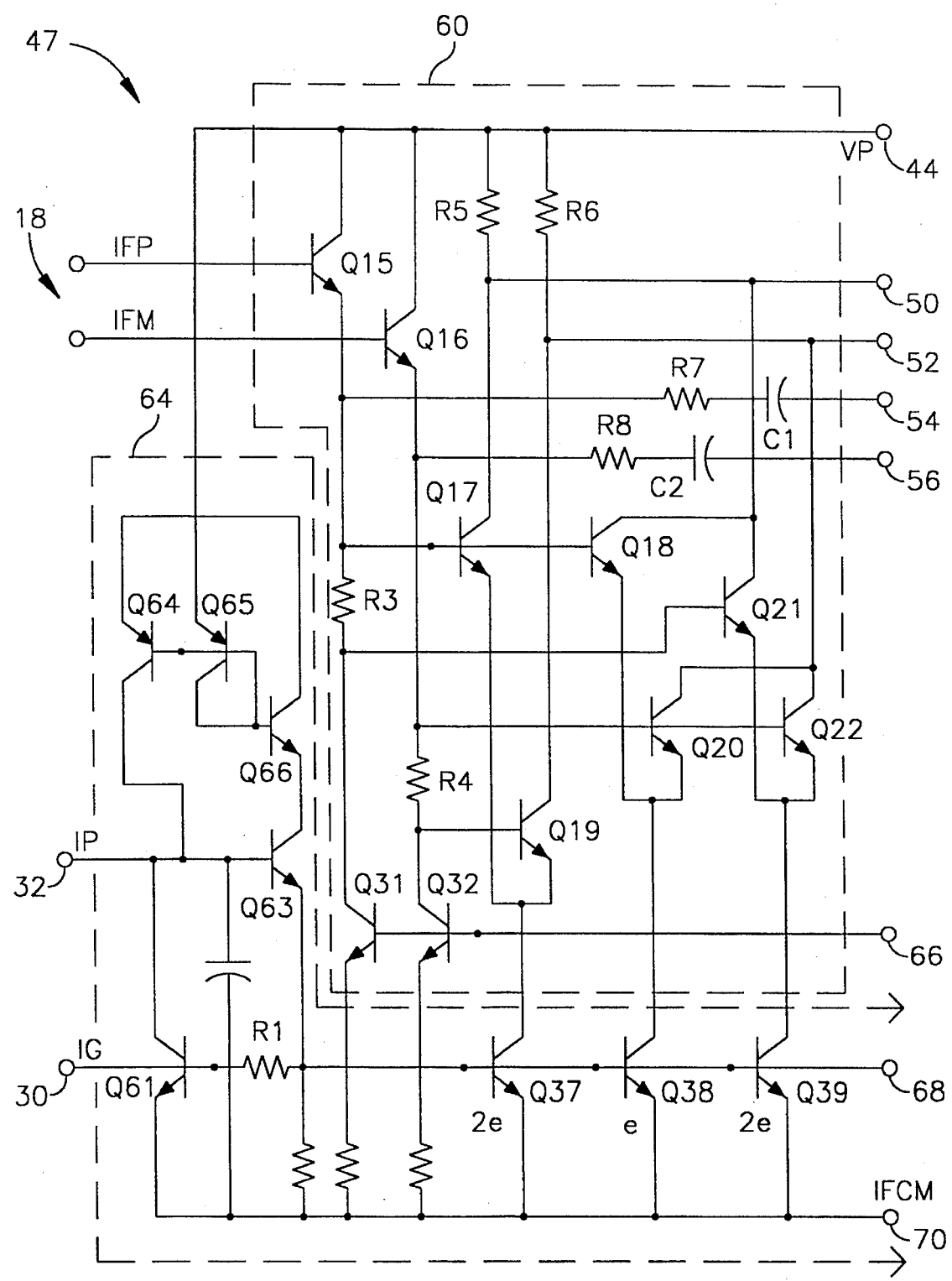
FIG. 5 is a detailed circuit diagram of a second amplifier stage for the amplifier system shown in FIG. 3.
Figure 6:
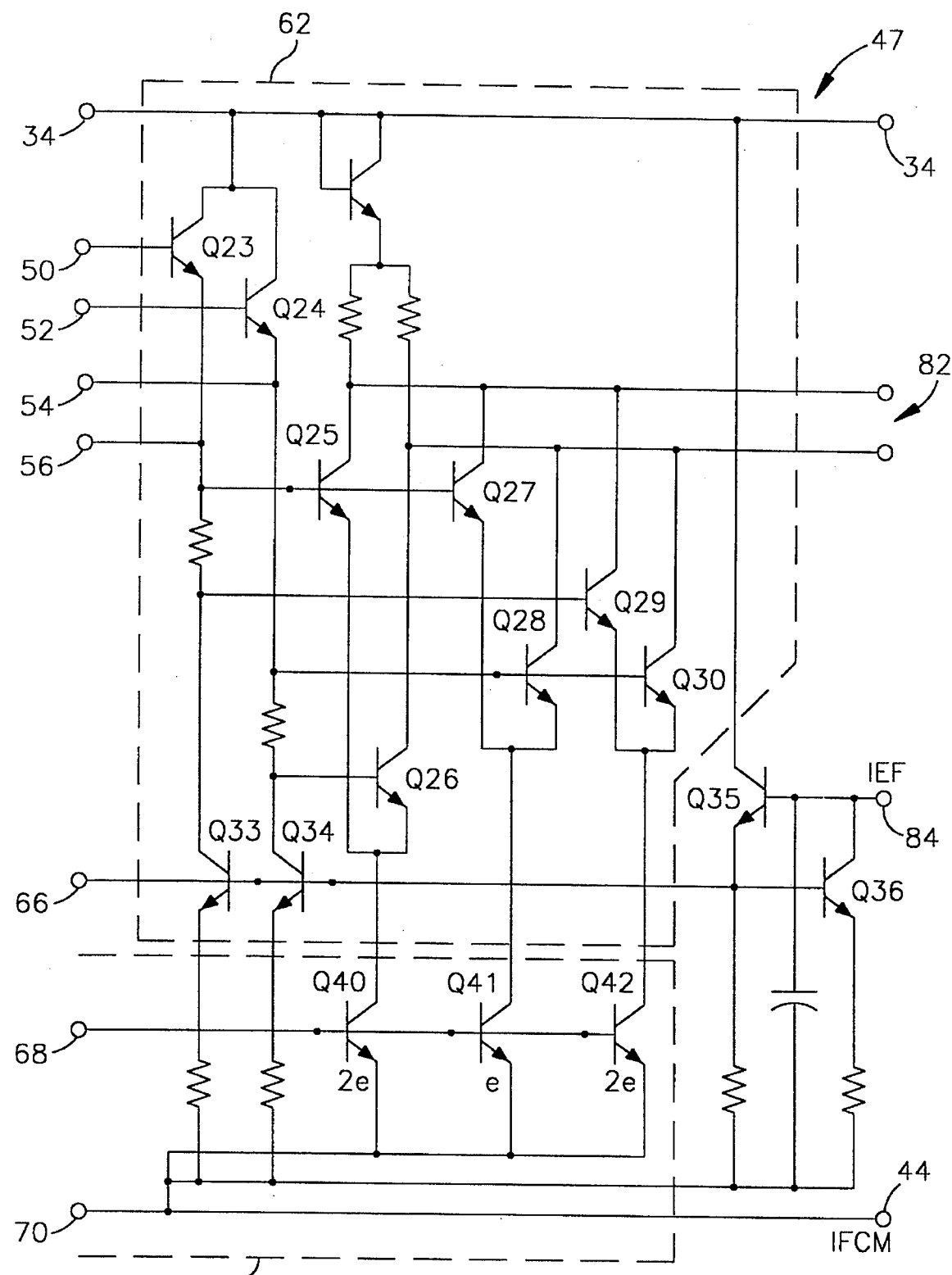
FIG. 6 is a detailed circuit diagram of a third amplifier stage for the amplifier system shown in FIG. 3.

FIGS. 5 and 6 are detailed circuit diagrams of the second and third amplifier stages in section 47. These stages follow similar design principles of the first stage, but operate at lower bias currents. As in the first stage, the second stage 60 and the third stage 62 both use multi-tanh triplets in lieu of simple differential gm pairs to improve the linearity of the overall transconductance, as described in my copending application. The multi-tanh triplets of the second and third stages, however, use proportional-to-absolute-temperature (PTAT) 66 $V_{BE}$'s to synthesize the effective emitter area ratios. The multi-tanh triplet of the second stage 60 is comprised of transistors Q17–Q22 (FIG. 5) and the multi-tanh triplet of the third stage comprised of transistors Q25–Q30 (FIG. 6). Each pair is coupled to a respective current-source transistor (e.g., Q37–Q39), which supplies a respective bias current thereto. In addition, emitter followers Q15 and Q16 are used in each amplifier circuit. Otherwise, the amplifier circuitry operates identically to that previously described in FIG. 4.

The second section 47 as in the first section, includes a gain control circuit 64, which is shared by both the second and third amplifier stages. The gain control circuit 64 is comprised of transistors Q61, Q64–Q66 and current-source transistors Q37–Q42 and operates in a manner similar to that shown in FIG. 2 and, therefore, will not be described in detail. A separate gain control circuit is used for the second and third stages in order to avoid coupling common mode noise between the two sections over a common control line. Alternatively, a single gain control circuit can be used for all stages if this is not a concern.

The differential IF signal (IFP and IFM) at terminal 18 is the differential output signal of the first amplifier stage (FIG. 4). The IF signal is applied to a pair of emitter-followers Q15, Q16. The emitter followers Q15 and Q16 work in conjunction with current-mirrors Q31–Q36 which are operated by a bias current IEF received at terminal 84.

All transistors Q15–Q22 in the second amplifier section 47 have the same emitter-area and are smaller than the transistors in the first amplifier section 45 (FIG. 4). Smaller transistors (having higher base resistance) can be used since noise is less important in later amplifier stages.

The voltages generated by Q15 and Q16 set up voltage drops in R3 and R4, and effectively establish an offset voltage, equivalent to an area ration, between the outer triplet transistors (Q17,Q19; Q21,Q22). The triplet supply current is again in the ratio 2:1:2, set by the emitter-areas of Q37–Q39, respectively. Thus, the second 60 and third 62 amplifier stages have approximately the same 1 dB compression point of −10 dB as the first amplifier stage 55 in FIG. 4. A 1 dB compression point is necessary because the minimum gain of these stages can be as low a 0 dB.

The voltages introduced by the bias current IEF at terminal 84 set up voltage drops across R3 and R4, which accordingly adjust the area ratio in the outer triplet transistors. Thus, different area ratios can be arranged by using equal sized transistors. For example, the product IR3*R3= kT/q (ln A). The area ratio "A" is then equal to A=exp(I3*R3/Vt). In the preferred embodiment I3*R3=50 mV. Therefore, the area ratio A=6.5. By changing area ratio with such offset voltages smaller equal sized transistors can be used for each amplifier circuit thereby improving high-frequency circuit performance.

The second amplifier stage 60 is loaded by resistors R5 and R6. To maximize available collector bias current, resistors R5 and R6 are taken directly to a reference voltage at terminal 44. The output of the second amplifier stage is again buffered and level-shifted by emitter followers Q23 and Q24 (FIG. 6) in the third stage.

At high frequencies a small amount of positive feedback is applied via the network formed by R7, C1, R8 and C2. The feedback network formed serves to extend the high frequency response at high gains, and has little effect at lower gains.

As described above, the third and final amplifier section 49 includes a final gain stage, which provides a fixed gain of 20 dB and also converts the differential input signal at 82 into a single-sided output signal IFOP at output terminal 37. It will be apparent to those skilled in the art that this final stage is unnecessary to achieve the objective of the present invention and is therefore optional. This final stage is included to demonstrate how the linear-in-dB control circuit can be incorporated in a wide variety of amplifier circuits having multiple stages. The invention is not limited to such designs.

The final gain stage uses active feedback to achieve a linear amplitude response. The output of the preceding stage is applied at inputs IF01 and IF02 to the differential pair Q50 and Q51. This pair is biased by Q54. A fraction of the output signal IFOP is applied to an identical gm stage made up of Q52, Q53, and the current supplied by Q55 via the gain-setting attenuatory R50–R52. The resistor values chosen for this attenuator result in the feedback voltage having the same source impedance (about 2KΩ) as the input voltage from the previous gain stage.

The biasing for this section is provided by the bias current IBAM supplied to terminal 39 and supported by Q63, assisted by Q64. Capacitor C50 provides high frequency (HF) stabilization for the loop around Q63–Q64, with a pole, in the preferred embodiment, at about 45 MHz.

The output of the gm stages is applied to a folded cascode Q57 and Q60, biased by the currents in Q56 and Q59, respectively. These currents are in turn established by the current in Q65–Q66 and R63. The voltage drop across R66 (nominally 300 mV PTAT), sets up the differential summing nodes at the emitters of the cascode transistors to about 460 mV below the supply voltage VP and provides minimal collector bias for Q56 and Q59.

The cascode outputs are applied to current mirror Q58 and Q61, augmented by Q62, biased by R59, emitter-degeneration resistors R58–R59, and HF bypass cap C51. The resulting voltage at the common collector node of Q60 and Q61 is buffered by complementary emitter-followers Q68 and Q69 operating at a predetermined bias current set by Q67 and Q70, respectively. A second pair of complementary emitter-followers Q72, Q73, provides an additional level of buffering. Transistor Q73 preferably includes two emitters in order that the collector resistances of Q72 and Q73 are more nearly equal, resulting in a more symmetrical output capability.

Built into the final stage 49 is a simple AGC detector, designed to stabilize the IF output to 0 dB when not over-ridden by the application of a manual gain-control voltage $V_G$ at terminal 51. Thus, the gain can either be manually adjusted by an output of a DAC operating under firmware control or, alternatively, without external control. The AGC detector provides this latter capability.

Figure 7A:
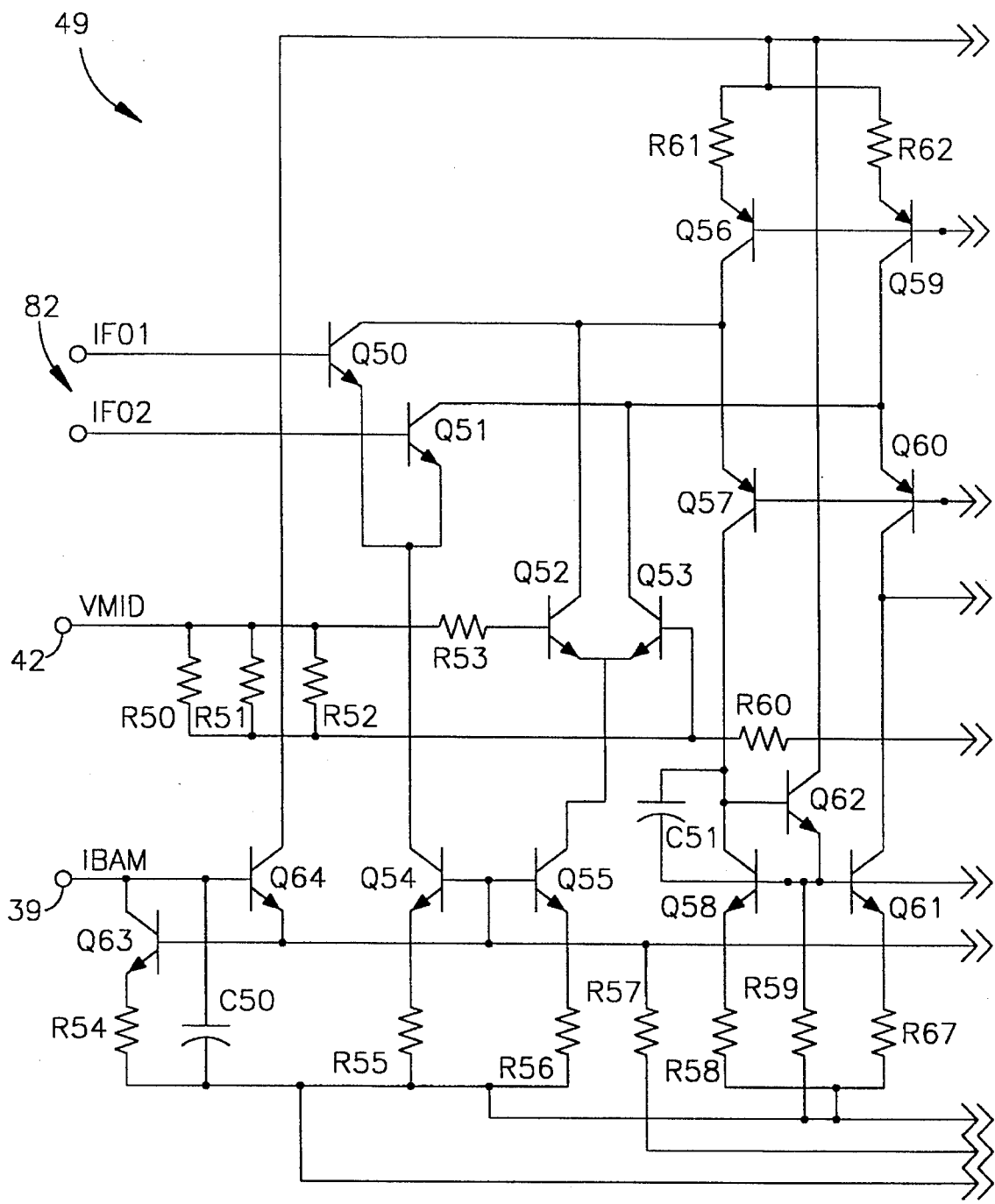
FIGS. 7A and 7B are detailed circuit diagram of a final, fixed-gain amplifier stage having an automatic gain control (AGO) detector for the amplifier system shown in FIG. 3.
Figure 7B:
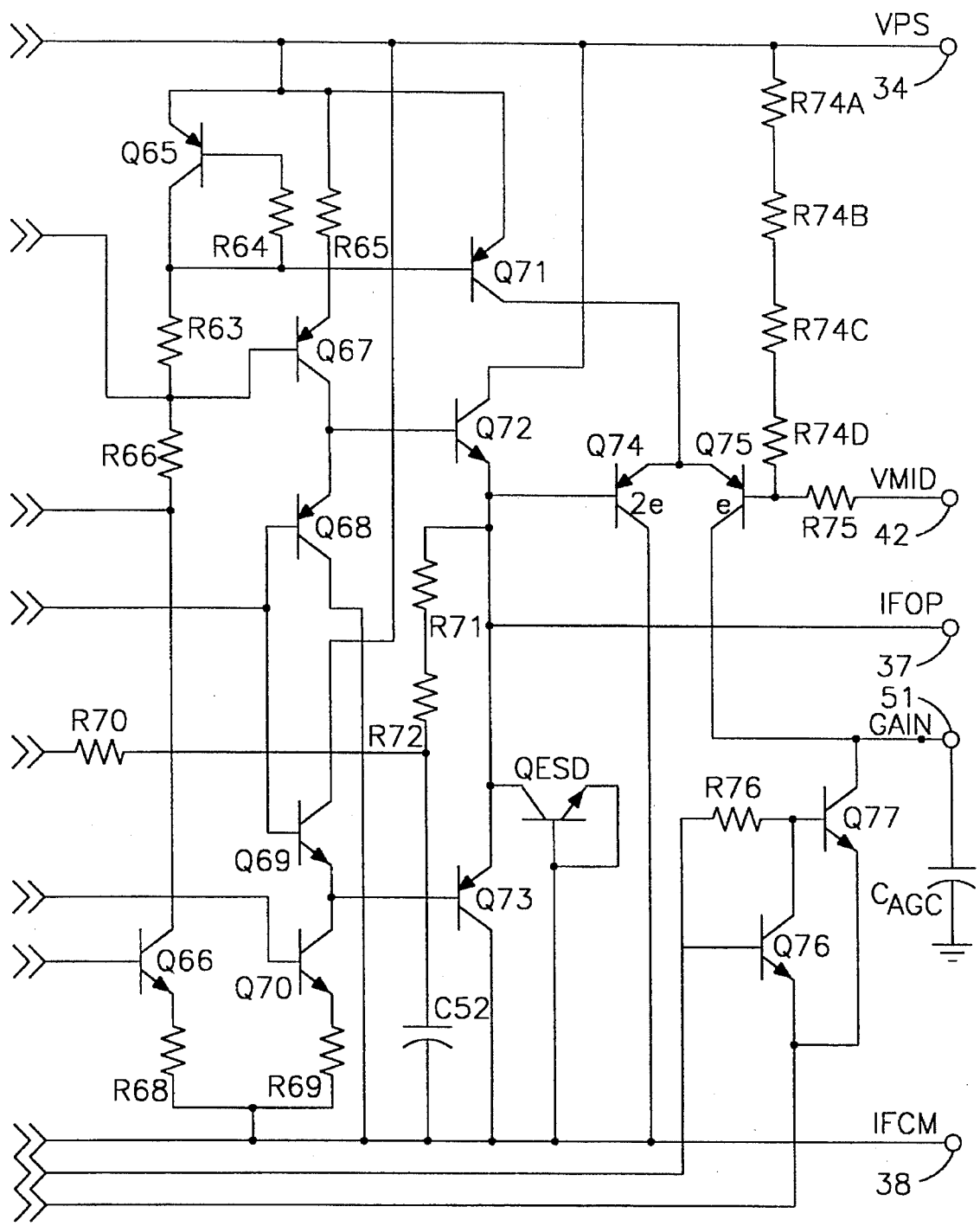

The AGC detector includes five transistors Q71, Q74–77 and three resistors R74–R76. In the preferred embodiment, the emitter-area ratio of Q74 to Q75, as shown in FIG. 7, is 2:1. Transistor Q71 provides a predetermined amount of PTAT current (76 µA) to transistors Q74 and Q75. Under zero-signal conditions, this current flows almost entirely in Q74 because of the voltage applied to the base of Q75, which is some 316 mV above the mid-point voltage VMID (nominally 1.5 V) at which the output of the amplifier is centered. The current in Q75 is thus essentially zero. As the amplitude of the signal IFOP increases, very little changes in these currents until a threshold is reached. Current then flows in Q75 during the time that the instantaneous voltage of IFOP is low; when this voltage is high, Q75 is heavily cut off. The collector current of this transistor therefore has the form of a short pulse, whose average current increases rapidly as the amplitude of the IFOP signal exceeds this threshold.

A second, DC current is provided by Q77, which is biased by Q76, whose $V_{BE}$ is dropped by approximately 53 mV PTAT (i.e., 53 µA×1KΩ) in R76. The emitter area ratio of 3:5 in these two transistors finally determines the collector current of Q77. This current is balanced, due to the action of the AGC loop, against the average (pulse) current from Q75 at a certain amplitude of IFOP. Transistors Q76–Q77 and resistor R76 form a well-known low value current source.

In use, the current at terminal 51 is integrated by a capacitor connected to ground. This integrates the current pulses, raising the gain-control voltage $V_G$ and thereby lowering the gain until a current-balance is established. This occurs in the preferred embodiment (by the choice of offset voltage at the base of Q75) to occur for an IFOP amplitude of 316 mV (0 dBm) when $V_P$=3 V. The IFOP amplitude is proportional to $V_P$. The AGC voltage VG can be used to indicate signal strength by lightly loading the terminal 51 with a resistor to ground.

Described above is a simple, yet accurate gain control circuit that, when used in combination with agm stage or its equivalent can produce a linear-in-decibel gain in the amplifier responsive to a linear change in a gain control current applied to the gain control circuit. This circuit has many applications, one being an automatic gain control amplifier such as described above. For another example, see my co-pending, commonly assigned application entitled "Variable Gain Mixer", filed herewith, which uses the gain control circuit 22 in a mixer application.

Having described and illustrated the principles of the invention in a preferred embodiment thereof, it should be apparent that the invention can be modified in arrangement and detail without departing from such principles. I claim all modifications and variation coming within the spirit and scope of the following claims.

I claim:

1. A linear-in-dB gain amplifier comprising:

an amplifier circuit having a gain that is proportional to an amplifier bias current; and a gain control circuit having an input terminal for receiving a gain control current and an output terminal coupled to the amplifier circuit for providing the amplifier bias current, the amplifier bias current varying exponentially in response to linear changes in the gain control current thereby producing an exactly linear-in-decibel relationship between the gain control current and the amplifier circuit gain over the entire range of the gain control current.

2. A linear-in-dB gain amplifier system comprising:

an amplifier circuit having a gain that is proportional to an amplifier bias current; and a gain control circuit including:

a first transistor having a control terminal for receiving a gain control current and being biased to an operating point, a second transistor having a control terminal and an input terminal coupled to the amplifier circuit for providing the amplifier bias current thereto, and a resistor coupled between the control terminals of the first and second transistors so that the gain control current passes through the resistor, the voltage across the resistor due to a linear change in the gain control current producing an exponential change in the amplifier bias current produced by the second transistor thereby producing a linear-in-decibel relationship between the gain control current and the amplifier circuit gain.

3. A linear-in-dB gain amplifier system according to claim 2 including a second resistor coupled between the control terminal of the second transistor and a supply voltage terminal.

4. A linear-in-dB gain amplifier system according to claim 3 wherein the first and second transistors each have a base forming the respective control terminal, a collector forming the respective input terminal and an emitter forming the respective output terminal;

the collector of the first transistor coupled to a reference terminal for receiving a reference current and the emitter of the first transistor coupled to the supply voltage terminal; and the collector of the second transistor coupled to the amplifier circuit and the emitter of the second transistor coupled to the supply voltage terminal, and the resistor coupled between the bases of the first and second transistors.

5. A linear-in-dB gain amplifier system according to claim 4 further including:

a third transistor having a base, a collector, and an emitter, the base of the third transistor coupled to the collector of the first transistor, the emitter of the third transistor coupled to the base of the second transistor, and the collector of the third transistor coupled to a second supply voltage terminal; and the second resistor coupled between the emitter of the third transistor and the supply voltage terminal.

6. A linear-in-dB gain amplifier system according to claim 5 including a compensation circuit coupled to the gain control circuit for maintaining a constant current at the collector of the first transistor independent of changes in the gain control current.

7. A linear-in-dB gain amplifier system according to claim 5 wherein the compensation circuit comprises:

a fourth transistor interposed between the collector of the third transistor and the second supply voltage terminal to sense the current through the third transistor; and a current mirror coupled between the fourth transistor and the third transistor to detect a base current required by the fourth transistor and provide a mirror of that base current to the base of the third transistor.

8. A linear-in-dB gain amplifier system according to claim 2 wherein the amplifier circuit comprises a multi-tanh n-tuple having a given emitter area ratio.

9. A linear-in-dB gain amplifier system according to claim 8 including means for synthesizing different emitter area ratios for each multi-tanh transistor pair while the emitter area for each transistor remains constant.

10. A method for controlling gain in an amplifier, comprising:

providing a differential pair of transistors having a pair of input terminals, a pair of output terminals, and a common collector node through which an amplifier bias current flows, the differential pair having a gain that varies linearly with the amplifier bias current;

providing a gain control current for varying the amplifier bias current;

generating the amplifier bias current in response to the gain control current;

providing the amplifier bias current to the common collector node of the differential pair; and varying the amplifier bias current exponentially in response to linear changes in the gain control current so that the amplifier gain changes exponentially in response to the gain control current to produce a linear-in-dB gain over the entire range of the gain control current.

11. A method for controlling gain in an amplifier, comprising:

providing an amplifier having a gain that varies linearly with an amplifier bias current;

providing a gain control current for varying the amplifier bias current; and varying the amplifier bias current exponentially in response to linear changes in the main control current so that the amplifier gain changes exponentially in response to the gain control current, wherein the step of varying the amplifier bias current includes generating a voltage across a resistor proportional to the gain control current, wherein the corresponding change in the amplifier bias current is an exponential function of the voltage.

12. A method according to claim 11 wherein the step of providing an amplifier includes the step of providing an amplifier having multiple stages, each stage having a gain that varies linearly with a corresponding amplifier bias current, and wherein the step of varying the amplifier bias current exponentially in response to linear changes in the gain control current includes varying each amplifier bias current exponentially in response to linear changes in the gain control current.

13. A method according to claim 12 wherein the step of providing an amplifier includes providing a multi-tanh n-tuple having a predetermined emitter area ratio.

14. A method according to claim 13 further including synthesizing the predetermined effective area ratio.

15. A multi-stage linear-in-decibel amplifier system, comprising:

multiple amplifier stages coupled together in series defining an amplifier system having an overall amplifier gain, the amplifier system receiving an input signal and generating an amplified output signal, each amplifier stage having a gain that varies according to a respective amplifier bias current; and a gain control circuit having an input for receiving a gain control current having a predetermined range and multiple outputs, each gain control circuit output coupled to a corresponding amplifier stage for providing a respective amplifier bias current, the gain control circuit including a resistor through which the gain control current flows thereby generating a voltage across the resistor, the gain control circuit varying the amplifier bias currents exponentially in proportion to linear changes in the voltage thereby providing linear-in-decibel control of the corresponding amplifier stage across the entire range of the control current.

16. A multi-stage linear-in-decibel amplifier system comprising:

multiple amplifier stages coupled together in series defining an amplifier system having an overall amplifier gain, the amplifier system receiving an input signal and generating an amplified output signal, each amplifier stage having a gain that varies according to a respective amplifier bias current;

a first transistor having a control terminal for receiving a gain control current and an input terminal for receiving a reference current;

multiple second transistors, each second transistor having a control terminal, an input terminal coupled to a corresponding amplifier stage for providing the respective amplifier bias current thereto, and an output terminal coupled to a supply voltage terminal; and a resistor coupled between the control terminal of the first transistor and the control terminals of the second transistors so that the gain control current passes through the resistor, the voltage across the resistor due to a linear change in the gain control current producing an exponential change in the current produced by the second transistor.

17. An amplifier system according to claim 16 wherein the first transistor has a first emitter area and the second transistor has a second emitter area, the ratio of the second emitter area to the first emitter area being equal to A:1.

18. An amplifier system according to claim 16 further including an emitter-follower for aiding in biasing the first transistor.

19. An amplifier system according to claim 18 further including means for beta compensating the emitter-follower.

20. An amplifier system according to claim 16 further including means for shunting the gain control current.

21. An amplifier system according to claim 15 wherein each amplifier stage includes a multi-tanh n-tuple.

22. An amplifier system according to claim 15 further including a second gain control circuit coupled to one or more of the amplifier stages for providing respective gain control currents thereto.

23. An amplifier system according to claim 15 further including an automatic gain control detector coupled to the amplifier system for detecting the amplitude of the output signal.

24. An amplifier system according to claim 15 further including a fixed gain amplifier stage in series with the multiple amplifier stages.

25. A linear-in-dB gain amplifier comprising:
   a differential pair of transistors having a pair of input terminals for receiving an input signal, a pair of output terminals for providing an output signal, and a common node for receiving an amplifier bias current;
   a first transistor having a control terminal for receiving a gain control current, an input terminal for receiving a reference current, and an output terminal coupled to a first supply voltage terminal;
   a second transistor having a control terminal, an input terminal coupled to the common node of the differential pair for providing the amplifier bias current, and an output terminal coupled to the first supply voltage terminal;
   a first resistor coupled between the control terminals of the first and second transistors,
   a third transistor having a control terminal coupled to the input terminal of the first transistor, an input terminal coupled to a second supply voltage terminal, and an output terminal to the control terminal of the second transistor;
   a second resistor coupled between output terminal of the third transistor and the first supply voltage terminal;
   the amplifier bias current varying exponentially in response to linear changes in the gain control current thereby producing a linear-in-decibel relationship between the gain control current and the amplifier circuit gain.

26. A linear-in-dB gain amplifier according to claim 25 wherein the first transistor includes a first emitter area (e) and the second transistor includes a second emitter area (Ae) so that the ratio of the second emitter area to the first emitter area is equal to a predetermined scaling factor (A) wherein the amplifier bias current is proportional to the predetermined scaling factor (A).

27. A linear-in-dB gain amplifier according to claim 25 further including a compensation circuit coupled to the control terminal of the third transistor for providing a control current to the third transistor so that all of the reference current flows into the input terminal of the first transistor.

28. A linear-in-dB gain amplifier according to claim 27 wherein the compensation circuit includes:
   a fourth transistor having a control terminal and being interposed between the second supply voltage terminal and the input terminal of the input terminal of the third transistor; and
   a current mirror coupled between the control terminal of the fourth transistor and the control terminal of the third transistor.

29. A method for controlling gain in an amplifier according to claim 10 wherein the step of varying the amplifier bias current exponentially in response to linear changes in the gain control current includes generating a voltage across a resistor proportional to the gain control current.

30. A method for controlling gain in an amplifier according to claim 11 wherein the step of generating a voltage across a resistor proportional to the gain control current includes:
   providing a first transistor and a second transistor, each transistor having a control terminal, an input terminal, and an output terminal;
   coupling the resistor between the control terminals of the first and second transistors;
   providing a reference current to the first transistor to bias the first transistor; and
   coupling the input terminal of the second transistor to the amplifier to provide an amplifier bias current thereto responsive to the voltage across the resistor.

* * * * *